United States Patent
Jia

(10) Patent No.: US 10,829,850 B2
(45) Date of Patent: Nov. 10, 2020

(54) EVAPORATION SOURCE AND EVAPORATION-DEPOSITION DEVICE HAVING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Xiaochen Jia, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 253 days.

(21) Appl. No.: 15/962,711

(22) Filed: Apr. 25, 2018

(65) Prior Publication Data
US 2019/0062899 A1 Feb. 28, 2019

(30) Foreign Application Priority Data
Aug. 31, 2017 (CN) .......................... 2017 1 0774309

(51) Int. Cl.
*C30B 35/00* (2006.01)
*C23C 14/24* (2006.01)

(52) U.S. Cl.
CPC ............ *C23C 14/243* (2013.01); *C30B 35/00* (2013.01)

(58) Field of Classification Search
CPC ......... C30B 25/00; C30B 23/00; C30B 23/03; C30B 35/00
See application file for complete search history.

(56) References Cited

U.S. PATENT DOCUMENTS

| | | | |
|---|---|---|---|
| 2002/0040682 A1* | 4/2002 | Ramsay ................ | C23C 14/243 118/723 EB |
| 2005/0205001 A1* | 9/2005 | Sherohman ............ | C30B 15/00 117/18 |
| 2011/0308449 A1* | 12/2011 | Katsuno ................ | C30B 23/005 117/84 |
| 2012/0137961 A1* | 6/2012 | Iwai ...................... | C30B 35/002 117/77 |
| 2017/0003076 A1* | 1/2017 | Matsuda ................. | H05B 3/62 |

FOREIGN PATENT DOCUMENTS

| CN | 206368212 | * | 8/2017 |
|---|---|---|---|
| CN | 206467334 | * | 9/2017 |

* cited by examiner

*Primary Examiner* — Robert M Kunemund
(74) *Attorney, Agent, or Firm* — Nath, Goldberg & Meyer; Joshua B. Goldberg

(57) ABSTRACT

The disclosure provides an evaporation source, comprising: a crucible body, having a first surface; and a crucible upper-lid, having a second surface in contact with the first surface in use, wherein one of the first surface and the second surface is provided with a convex portion and the other is provided with a concave portion capable of being engaged with the convex portion. The disclosure also provides an evaporation-deposition device having the evaporation source.

18 Claims, 4 Drawing Sheets

EVAPORATION SOURCE AND EVAPORATION-DEPOSITION DEVICE HAVING THE SAME

CROSS-REFERENCE TO RELATED APPLICATION

This application claims the benefit of China Patent Application No. 201710774309.X, filed on Aug. 31, 2017, titled "EVAPORATION SOURCE AND EVAPORATION-DEPOSITION DEVICE HAVING THE SAME", which is hereby incorporated by reference herein in its entirety.

FIELD

The present disclosure relates to the field of display device manufacturing, and in particular, to an evaporation source and an evaporation-deposition device having the same.

BACKGROUND

Evaporation-deposition devices are experimental and production equipments utilized in the field of thin film preparation. It is widely used in organic photoelectric fields such as Organic Light Emitting Diodes (OLEDs), Organic Solar Cells (OPVs), and Organic Field Effect Transistors (OFETs).

FIG. 1 is a schematic cross-sectional view of a conventional linear evaporation source, and FIG. 2 is a partial enlarged view of a region A in FIG. 1. As shown in FIGS. 1 and 2, a conventional linear evaporation source includes a crucible body 1 and a crucible upper-lid 2 (including a nozzle 3). In the evaporation-deposition process, the upper-lid 2 needs to be fixed to an upper portion of the crucible body 1, such that the crucible body 1 and the upper-lid 2 can form a closed chamber.

However, in practical applications, it has been found that surfaces 4 where the crucible body 1 is brought into contact with the crucible upper-lid 2 are very smooth, and relative sliding between the crucible body 1 and the crucible upper-lid 2 occurs in the evaporation-deposition process as a pressure within the closed chamber increases. As a result, a gap may be incurred between the crucible body 1 and the crucible upper-lid 2, leading to a problem of leakage of the evaporated gas to affect the normal evaporation-deposition process.

SUMMARY

The disclosure provides an evaporation source and an evaporation-deposition device having the evaporation source.

According to an embodiment of the disclosure, there is provided an evaporation source, comprising: a crucible body, having a first surface; and a crucible upper-lid, having a second surface in contact with the first surface in use, wherein one of the first surface and the second surface is provided with a convex portion and the other is provided with a concave portion capable of being engaged with the convex portion.

Optionally, a thermal expansion layer having a thermal expansion coefficient greater than the concave portion is provided on the surfaces of the convex portion and/or the concave portion.

Optionally, the concave portion is made of titanium.

Optionally, the material of the thermal expansion layer is selected from one of copper, aluminium, and iron.

Optionally, the convex portion has a thermal expansion coefficient greater than the concave portion.

Optionally, the convex portion has a cross-section in a rectangular or triangular shape.

Optionally, the crucible body comprises a crucible bottom and a crucible sidewall extending upward from the crucible bottom, the first surface being an end surface of the crucible sidewall facing the crucible upper-lid; and the crucible upper-lid comprises a top plate and an upper-lid sidewall extending downward from the top plate, the second surface being an end surface of the upper-lid sidewall facing the crucible body.

Optionally, the convex portion is formed in a closed shape around the crucible sidewall on the first surface, and the concave portion is formed in a closed shape around the upper-lid sidewall on the second surface.

Optionally, the convex portion is formed in a closed shape around the upper-lid sidewall on the second surface, and the concave portion is formed in a closed shape around the crucible sidewall on the first surface.

Optionally, a plurality of convex portions are formed in a closed shape around the crucible sidewall on the first surface, and a plurality of concave portions are formed in a closed shape around the upper-lid sidewall on the second surface.

Optionally, a plurality of convex portions are formed in a closed shape around the upper-lid sidewall on the second surface, and a plurality of concave portions are formed in a closed shape around the crucible sidewall on the first surface.

Optionally, the convex portion is integrally formed with the first surface of the crucible sidewall.

Optionally, the convex portion is integrally formed with the second surface of the upper-lid sidewall.

Optionally, an outside surface of the crucible sidewall is provided with a first connecting portion having a first through hole, and an outside surface of the upper-lid sidewall is provided with a second connecting portion having a second through hole; and the evaporation source further comprises a screw configured to pass through the first through hole and the second through hole to connect the first connection portion and the second connection portion.

According to an embodiment of the disclosure, there is provided an evaporation-deposition device having an evaporation source, wherein the evaporation source comprises: a crucible body, having a first surface; and a crucible upper-lid, having a second surface in contact with the first surface in use, wherein one of the first surface and the second surface is provided with a convex portion and the other is provided with a concave portion capable of being engaged with the convex portion.

DETAILED DESCRIPTION OF THE EMBODIMENTS

In order to better understand the technical solutions of the present disclosure by those skilled in the art, an evaporation source and an evaporation-deposition device according to the present disclosure will be described in detail below in conjunction with the accompanying drawings.

Figure 1:
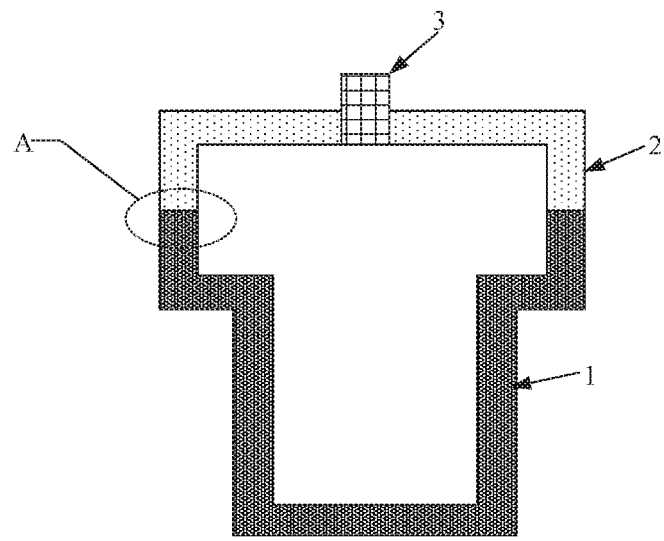
FIG. 1 is a schematic cross-sectional diagram of a conventional linear evaporation source.
Figure 2:
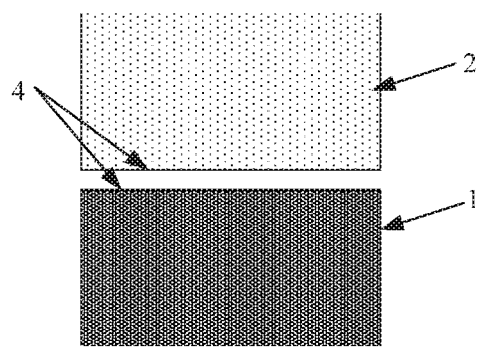
FIG. 2 is a partial enlarged diagram of region A in FIG. 1.
Figure 3:
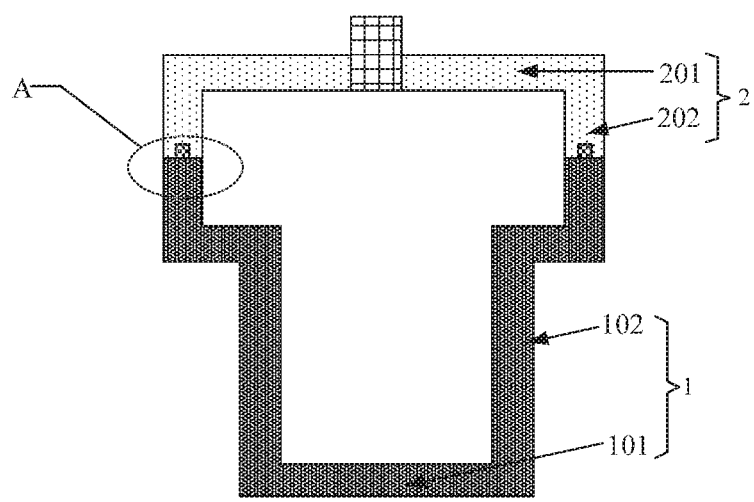
FIG. 3 is a schematic longitudinal cross-sectional diagram of an evaporation source according to an embodiment of the present disclosure.
Figure 4:
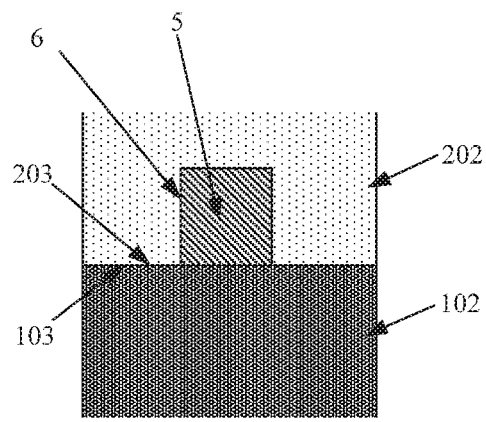
FIG. 4 is a partial enlarged diagram of the region A in FIG. 3.

FIG. 3 is a longitudinal cross-sectional diagram of an evaporation source according to an embodiment of the present disclosure; and FIG. 4 is a partial enlarged diagram of the region A in FIG. 3. As shown in FIGS. 3 and 4, the evaporation source according to this embodiment includes: a crucible body 1 having a first surface 103; and a crucible upper-lid 2 having a second surface 203 in contact with the first surface 103 in use, wherein one of the first surface 103 and the second surface 203 is provided with a convex portion 5, and the other is provided with a concave portion 6 that can be engaged with the convex portion 5.

In this embodiment, the convex portion 5 is located on the first surface 103, and the concave portion 6 is located on the second surface 203.

During the evaporation-deposition process, the crucible upper-lid 2 is placed above the crucible body 1, such that the convex portions 5 on the crucible body 1 and the concave portions 6 on the crucible upper-lid 2 are mutually engaged. Specifically, the convex portion 5 on the crucible body 1 can be inserted into the concave portion 6 on the crucible upper-lid 2 to achieve a tight connection between the crucible upper-lid 2 and the crucible body 1. In this manner, relative slippage between the crucible upper-lid 2 and the crucible body 1 can be effectively prevented, thereby keeping away from the leakage of the evaporated gas.

Preferably, a plurality of convex portions 5 may be provided in the present disclosure. The plurality of convex portions 5 can further enhance the tightness between the crucible upper-lid 2 and the crucible body 1.

In this embodiment, the crucible body 1 includes a crucible bottom 101 and a crucible sidewall 102 extending upward from the crucible bottom 101. The crucible upper-lid 2 includes a top plate 201 and an upper-lid sidewall 202 extending downward from the top plate 201. An end of the crucible sidewall 102 is opposite to an end of the upper-lid sidewall 202. In use, the first surface 103 may be an end surface of the crucible sidewall 102 facing the upper-lid sidewall 202, and the second surface 203 may be an end surface of the upper-lid sidewall 202 facing the crucible sidewall 102.

In this embodiment, optionally, a cross-section of the convex portion 5 is in a rectangular shape. Correspondingly, a cross-section of the concave portion 6 is a rectangular shape. The rectangular-shaped concave portion 6 and the convex portion 5 can facilitate the engagement and disengagement operations of the crucible upper-lid 2 and the crucible body 1 while avoiding relative sliding between the crucible upper-lid 2 and the crucible body 1. It should be noted that the convex portion 5 and the concave portion 6 according to the present disclosure may be formed in any other suitable cross-sectional shape, such as a triangle or a semicircle.

Figure 5:
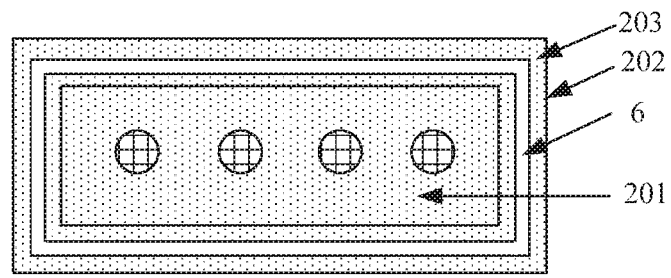
FIG. 5 is a bottom diagram of a crucible upper-lid in FIG. 3.
Figure 6:
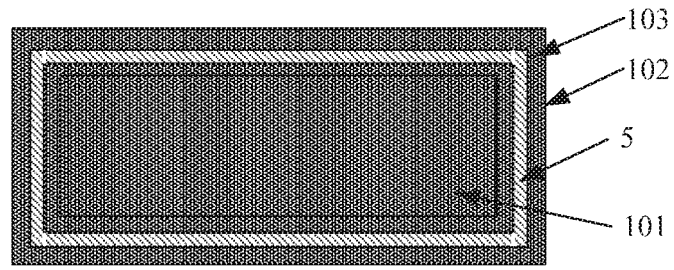
FIG. 6 is a top plan diagram of a crucible body in FIG. 3.

FIG. 5 is a bottom diagram of the crucible upper-lid shown in FIG. 3, and FIG. 6 is a top plan diagram of the crucible body shown in FIG. 3. As shown in FIGS. 5 and 6, the convex portion 5 is formed in a closed shape around the crucible sidewall 102 on the first surface 103, and the concave portion 6 is formed in a closed shape around the upper-lid sidewall 202 on the second surface 202. In this regard, even if the upper-lid 2 is slightly raised by a high pressure inside the crucible such that the end of the upper-lid sidewall 202 (i.e., the second surface 203) is separated from the end of the crucible sidewall 102 (i.e., the first surface 103), the convex portion 5 provided between the end of the upper-lid sidewall 202 and the end of the crucible sidewall 102 can prevent the leakage of the evaporated gas from a gap between the two ends. In this way, the process chamber can be maintained in a sealed state.

It should be noted that the shapes of the crucible sidewall 102, the upper-lid sidewall 202, the convex portion 5, and the concave portion 6 as shown are merely exemplary. Those skilled in the art can utilize other shapes of the crucible sidewall 102, the upper-lid sidewall 202, the convex portion 5, and the concave portion 6 on demand.

In other embodiments, the convex portions 5 may be formed in other shapes on the first surface 103 except for the closed shape.

Preferably, the convex portion 5 is integrally formed with the crucible sidewall 102.

It should be noted that the case where the above-mentioned convex portion 5 is located on the first surface 103 at the end of the crucible sidewall 102 and the concave portion 6 is located on the second surface 203 of the upper-lid sidewall 202 is only exemplary. In other embodiments, the concave portion 6 may be disposed on the first surface 103 of at the end of the crucible sidewall 102, and the convex portion 5 may be disposed on the second surface 203 at the upper-lid sidewall 202. In this manner, it is also possible to effectively prevent the leakage of evaporated gas during the evaporation-deposition process.

Preferably, an outside surface of the crucible sidewall 102 is provided with a first connecting portion having a first through hole, and an outside surface of the upper-lid sidewall 202 is provided with a second connecting portion having a second through hole. A screw is configured to pass through the first through hole and the second through hole to connect the first connection portion and the second connection portion. In this embodiment, the first connecting portion outside the crucible sidewall 102 and the second connecting portion outside the upper-lid sidewall 202 are connected by the screw such that the crucible sidewall 102 and the upper-lid sidewall 202 are fixed. In this manner, it is possible to prevent the relative movement between the crucible sidewall 102 and the upper-lid sidewall 202 during the evaporation-deposition process.

The evaporation source according to an embodiment of the present disclosure includes a crucible body 1 and a crucible upper-lid 2. The crucible body 1 includes a crucible bottom 101 and a crucible sidewall 102 extending upward from the crucible bottom 101. The crucible upper-lid 2 includes a top plate 201 and an upper-lid sidewall 202 extending downward from the top plate 201 such that an end of the crucible sidewall 102 is disposed opposite to an end of the upper-lid sidewall 202. Here, an end surface of the crucible sidewall 102 facing the upper-lid sidewall 202 is a first surface 103, and an end surface of the upper-lid sidewall 202 facing the crucible sidewall 102 is a second surface 203. One of the first surface 103 and the second surface 203 is provided with a convex portion 5, and the other one is provided with a concave portion 6 that can fit to the convex portion 5. In this embodiment of the present disclosure, by providing the concave portion 6 and the convex portion 5 that can cooperate with each other at the end of the upper-lid sidewall 202 and the end of the crucible sidewall 102, respectively, the relative sliding between the crucible upper-lid 2 and the crucible body 1 can be effectively prevented, so as to effectively keep away from the leakage of the evaporated gas.

Figure 7:
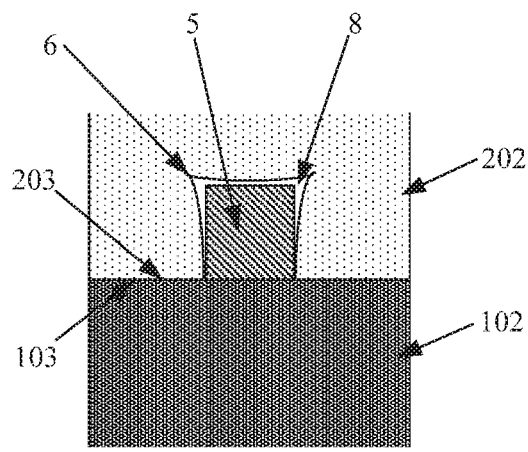
FIG. 7 is a schematic diagram of a concave portion and a convex portion in a condition of thermal expansion.

FIG. 7 is a schematic diagram of the concave portion and the convex portion in a condition of thermal expansion. As shown in FIG. 7, it has been found during the production process that the convex portion 5 and the concave portion 6 may be subjected to the thermal expansion as the temperature of the crucible body 1 and the crucible upper-lid 2 increases. The convex portion 5 in the condition of thermal expansion may be uniformly deformed, while the concave portion 6 in the condition of thermal expansion may be deformed more significantly at an opening than at a bottom thereof due to the influence of the stress of the concave portion 6 itself. In this regard, only the opening of the concave portion 6 is in close contact with the convex portion 5, while the other portion thereof is not attached. As a result, a gap 8 may be incurred between the convex portion 5 and the concave portion 6.

Figure 8:
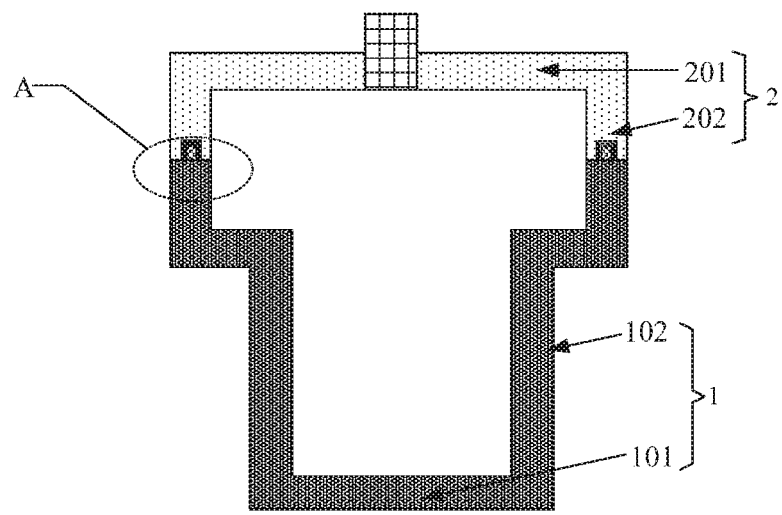
FIG. 8 is a schematic longitudinal cross-sectional diagram of an evaporation source according to an embodiment of the present disclosure.
Figure 9:
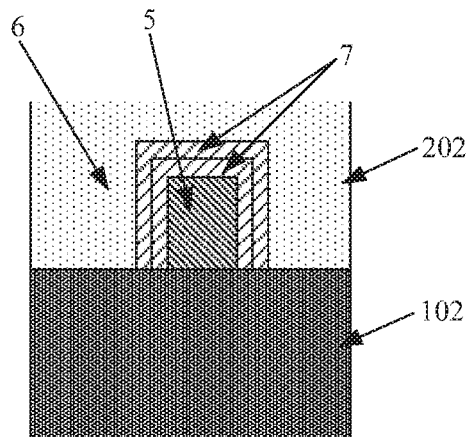
FIG. 9 is a partial enlarged diagram of region A in FIG. 8.
Figure 10:
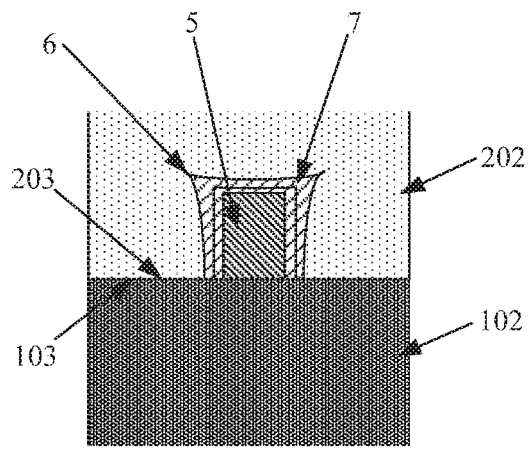
FIG. 10 is a schematic diagram of a thermal expansion layer, a concave portion and a convex portion in a condition of thermal expansion.

In order to solve the above technical problems, the present disclosure also provides an improvement of an evaporation source. FIG. 8 is a schematic longitudinal cross-sectional diagram of an evaporation source according to an embodiment of the present disclosure, FIG. 9 is a partial enlarged diagram of a region A in FIG. 8, and FIG. 10 is a schematic diagram of a thermal expansion layer, a concave portion, and a convex portion in a condition of thermal expansion. As shown in FIGS. 8 to 10, different from the above-described embodiments, in this embodiment, a thermal expansion layer 7 is provided on the surfaces of the convex portion 5 and the concave portion 6, and the thermal expansion layer 7 has a thermal expansion coefficient greater than the concave portion 6. In this manner, the thermal expansion deformation of the thermal expansion layer 7 during the evaporation-deposition is larger than the thermal expansion deformation of the concave portion 6 to fill the gap between the convex portion 5 and the concave portion 6, thereby effectively keeping away from the leakage of the evaporated gas.

Table 1 shows the thermal expansion coefficients and melting points of copper, aluminium, iron, and titanium.

TABLE 1

| Metals | Thermal Expansion Coefficients | Melting Points/° C. |
|---|---|---|
| Copper | 17.5 | 1083.4 |
| Aluminium | 23.2 | 660 |
| Iron | 12.2 | 1538 |
| Titanium | 10.8 | 1668 |

In practical applications, an ambient temperature in the evaporation source is approximately 400° C. The crucible upper-lid 2 is made of titanium metal having the thermal expansion coefficient of 10.8. Therefore, the material of the thermal expansion layer 7 is selected such that the material of the thermal expansion layer 7 is required to have a thermal expansion coefficient greater than 10.8 and a melting point higher than 400° C. Based on the above requirements, the material of the thermal expansion layer 7 in this embodiment may be selected from one of metallic copper, metallic aluminium, and metallic iron.

It should be noted that the case where the thermal expansion layers 7 are provided on the surfaces of the convex portion 5 and the concave portion 6 described above is an optional embodiment in the present disclosure. It should be understood by those skilled in the art that the thermal expansion layer 7 may be provided only on one surface of the convex portion 5 and the concave portion 6 as long as the gap between the concave portion 6 and the convex portion 5 is effectively filled.

As another optional embodiment of the present disclosure, the thermal expansion coefficient of the convex portion 5 may be greater than the thermal expansion coefficient of the concave portion 6 such that the thermal expansion deformation of the convex portion 5 is larger than the thermal expansion deformation of the concave portion 6 during the evaporation-deposition process. In this regard, when the convex portion 5 is inserted into the concave portion 6 to be heated, the convex portion 5 can completely fill the concave portion 6. In this manner, a large frictional force can be generated between the convex portion 5 and the concave portion 6, such that the occurrence of the gap can be effectively avoided.

Figure 11:
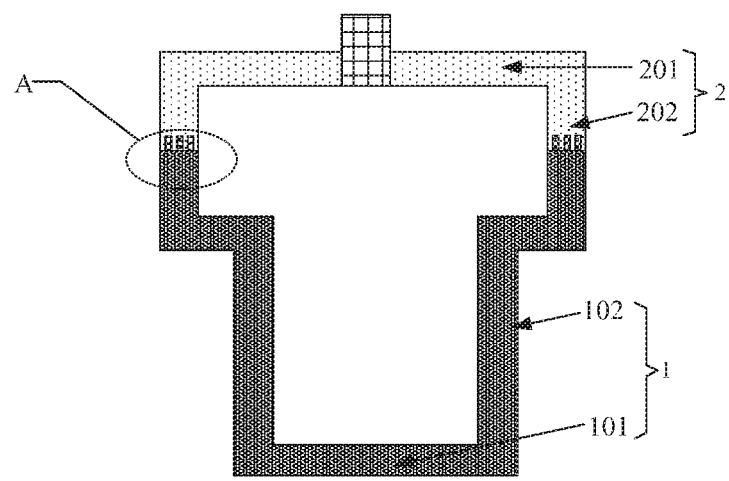
FIG. 11 is a schematic cross-sectional diagram of an evaporation source according to an embodiment of the present disclosure.
Figure 12:
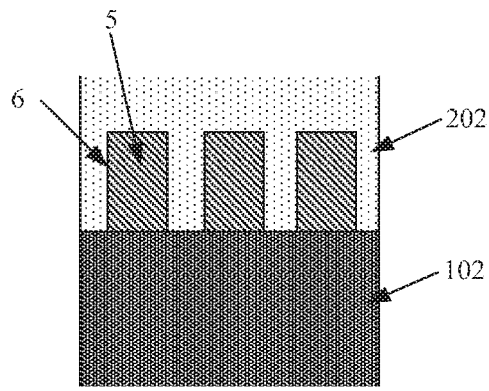
FIG. 12 is a partial enlarged diagram of the region A in FIG. 11.
Figure 13:
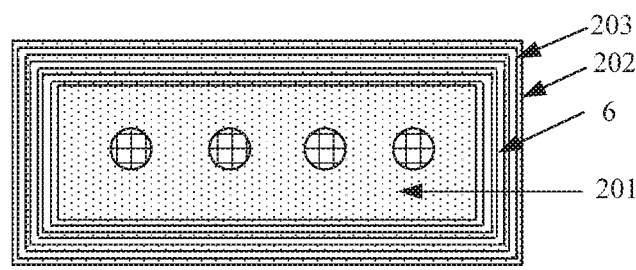
FIG. 13 is a bottom diagram of a crucible upper-lid in FIG. 11.
Figure 14:
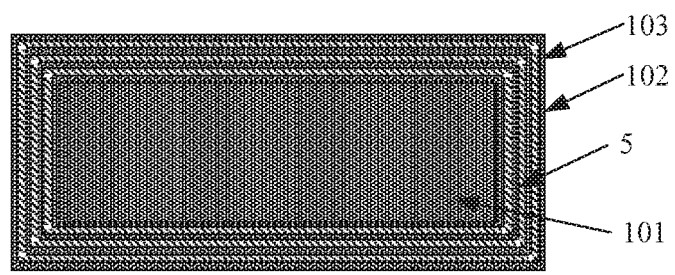
FIG. 14 is a top plan diagram of a crucible body in FIG. 11.

FIG. 11 is a schematic cross-sectional diagram of an evaporation source according to an embodiment of the present disclosure, FIG. 12 is a partial enlarged diagram of a region A in FIG. 11, and FIG. 13 is a bottom diagram of a crucible upper-lid in FIG. 11, and FIG. 14 is a top plan diagram of a crucible body in FIG. 11. As shown in FIGS. 11 to 14, different from the above-described embodiments, according to this embodiment, a plurality of convex portions 5 are arranged on the first surface 103 in a closed shape around the crucible sidewall 102. The plurality of convex portions 5 can further enhance the tightness between the end of the crucible sidewall 102 and the end of the upper-lid sidewall 202.

It should be noted that the case where the plurality of convex portions 5 as shown in FIG. 11 to FIG. 14 are all arranged on the first surface 103 in a closed shape around the crucible sidewall 102 is only an optional embodiment in the present disclosure. For example, in other embodiments of the present disclosure, some of the plurality of convex portions 5 may be disposed on the crucible body 1, and others may be disposed on the crucible upper-lid 2.

There is also provided an evaporation-deposition device in an embodiment of the present disclosure, including an evaporation source that employs the evaporation source described in any one of the above embodiments. Since the evaporation-deposition device according to this embodiment of the present disclosure employs the evaporation source described in any of the above embodiments, the evaporation-deposition device may have the advantages of the evaporation source according to the embodiments of the present disclosure.

It can be understood that the above embodiments are merely exemplary embodiments provided for illustrating the principle of the present disclosure. However, the present disclosure is not limited thereto. For a person of ordinary skill in the art, variations and improvements may be made without departing from the spirit and essence of the present disclosure, and these variations and improvements are also constructed within the scope of the present disclosure.

What is claimed is:

1. An evaporation source, comprising:
   a crucible body, having a first surface; and
   a crucible upper-lid, having a second surface in contact with the first surface in use, wherein one of the first surface and the second surface is provided with a convex portion and the other is provided with a concave portion capable of being engaged with the convex portion, wherein
   the crucible body comprises a crucible bottom and a crucible sidewall extending upward from the crucible bottom,
   an outside surface of the crucible sidewall is provided with a first connecting portion having a first through hole, and an outside surface of the upper-lid sidewall is provided with a second connecting portion having a second through hole; and
   the evaporation source further comprises a screw configured to pass through the first through hole and the second through hole to connect the first connection portion and the second connection portion.

2. The evaporation source according to claim 1, wherein a thermal expansion layer having a thermal expansion coefficient greater than the concave portion is provided on the surfaces of the convex portion and/or the concave portion.

3. The evaporation source according to claim 2, wherein the concave portion is made of titanium.

4. The evaporation source according to claim 3, wherein the material of the thermal expansion layer is selected from one of copper, aluminium, and iron.

5. The evaporation source according to claim 1, wherein the convex portion has a thermal expansion coefficient greater than the concave portion.

6. The evaporation source according to claim 1, wherein the convex portion has a cross-section in a rectangular or triangular shape.

7. The evaporation source according to claim 1, wherein
   the first surface being an end surface of the crucible sidewall facing the crucible upper-lid; and
   the crucible upper-lid comprises a top plate and an upper-lid sidewall extending downward from the top plate, the second surface being an end surface of the upper-lid sidewall facing the crucible body.

8. The evaporation source according to claim 7, wherein the convex portion is formed in a closed shape around the crucible sidewall on the first surface, and the concave portion is formed in a closed shape around the upper-lid sidewall on the second surface.

9. The evaporation source according to claim 7, wherein the convex portion is formed in a closed shape around the upper-lid sidewall on the second surface, and the concave portion is formed in a closed shape around the crucible sidewall on the first surface.

10. The evaporation source according to claim 7, wherein a plurality of convex portions are formed in a closed shape around the crucible sidewall on the first surface, and a plurality of concave portions are formed in a closed shape around the upper-lid sidewall on the second surface.

11. The evaporation source according to claim 7, wherein a plurality of convex portions are formed in a closed shape around the upper-lid sidewall on the second surface, and a plurality of concave portions are formed in a closed shape around the crucible sidewall on the first surface.

12. The evaporation source according to claim 7, wherein the convex portion is integrally formed with the first surface of the crucible sidewall.

13. The evaporation source according to claim 7, wherein the convex portion is integrally formed with the second surface of the upper-lid sidewall.

14. An evaporation-deposition device having an evaporation source, wherein the evaporation source comprises:
    a crucible body, having a first surface; and
    a crucible upper-lid, having a second surface in contact with the first surface in use, wherein one of the first surface and the second surface is provided with a convex portion and the other is provided with a concave portion capable of being engaged with the convex portion, wherein
    the crucible body comprises a crucible bottom and a crucible sidewall extending upward from the crucible bottom,
    an outside surface of the crucible sidewall is provided with a first connecting portion having a first through hole, and an outside surface of the upper-lid sidewall is provided with a second connecting portion having a second through hole, and
    the evaporation source further comprises a screw configured to pass through the first through hole and the second through hole to connect the first connection portion and the second connection portion.

15. The evaporation-deposition device according to claim 14, wherein a thermal expansion layer having a thermal expansion coefficient greater than the concave portion is provided on the surfaces of the convex portion and/or the concave portion.

16. The evaporation-deposition device according to claim 14, wherein the convex portion has a thermal expansion coefficient greater than the concave portion.

17. The evaporation-deposition device according to claim 14, wherein the convex portion has a cross-section in a rectangular or triangular shape.

18. The evaporation-deposition device according to claim 14, wherein
    the first surface being an end surface of the crucible sidewall facing the crucible upper-lid; and
    the crucible upper-lid comprises a top plate and an upper-lid sidewall extending downward from the top plate, the second surface being an end surface of the upper-lid sidewall facing the crucible body.

* * * * *